US010696932B2

(12) United States Patent
Sakamuri et al.

(10) Patent No.: US 10,696,932 B2
(45) Date of Patent: Jun. 30, 2020

(54) CLEANING COMPOSITION

(71) Applicant: FUJIFILM ELECTRONIC MATERIALS U.S.A., INC., N. Kingstown, RI (US)

(72) Inventors: Raj Sakamuri, Sharon, MA (US); Ognian N. Dimov, Warwick, RI (US); Ahmad A. Naiini, East Greenwich, RI (US); Sanjay Malik, Attleboro, MA (US); Binod B. De, Attleboro, MA (US); William A. Reinerth, Riverside, RI (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 82 days.

(21) Appl. No.: 15/745,203

(22) PCT Filed: Jul. 28, 2016

(86) PCT No.: PCT/US2016/044423
§ 371 (c)(1),
(2) Date: Jan. 16, 2018

(87) PCT Pub. No.: WO2017/023677
PCT Pub. Date: Feb. 9, 2017

(65) Prior Publication Data
US 2019/0016999 A1    Jan. 17, 2019

Related U.S. Application Data

(60) Provisional application No. 62/200,236, filed on Aug. 3, 2015.

(51) Int. Cl.
| C11D 7/50 | (2006.01) |
| C11D 11/00 | (2006.01) |
| H01L 21/02 | (2006.01) |
| H01L 21/311 | (2006.01) |
| C11D 3/00 | (2006.01) |
| G03F 7/42 | (2006.01) |
| C11D 7/32 | (2006.01) |
| C09G 1/02 | (2006.01) |
| C09D 5/08 | (2006.01) |
| C11D 3/12 | (2006.01) |
| C11D 3/30 | (2006.01) |
| C11D 3/43 | (2006.01) |
| G03F 7/20 | (2006.01) |
| G03F 7/027 | (2006.01) |

(52) U.S. Cl.
CPC ............ *C11D 11/0047* (2013.01); *C09D 5/08* (2013.01); *C09G 1/02* (2013.01); *C11D 3/0073* (2013.01); *C11D 3/122* (2013.01); *C11D 3/30* (2013.01); *C11D 3/43* (2013.01); *C11D 7/32* (2013.01); *C11D 7/3209* (2013.01); *C11D 7/3218* (2013.01); *C11D 7/3281* (2013.01); *C11D 7/50* (2013.01); *C11D 7/5004* (2013.01); *C11D 11/00* (2013.01); *G03F 7/425* (2013.01); *G03F 7/426* (2013.01); *H01L 21/02063* (2013.01); *H01L 21/31133* (2013.01); *G03F 7/027* (2013.01); *G03F 7/2053* (2013.01)

(58) Field of Classification Search
CPC .................................................. C11D 11/0047
USPC ......................................................... 510/175
See application file for complete search history.

(56) References Cited

U.S. PATENT DOCUMENTS

| 5,795,702 | A | 8/1998 | Tanabe et al. | |
| 6,114,240 | A | 9/2000 | Akram et al. | |
| 6,191,086 | B1 | 2/2001 | Leon et al. | |
| 8,357,646 | B2 | 1/2013 | Liu et al. | |
| 9,012,387 | B2 | 4/2015 | Atkinson et al. | |
| 9,068,153 | B2 | 6/2015 | Takahashi et al. | |
| 9,217,929 | B2 | 12/2015 | Egbe et al. | |
| 9,726,978 | B2 | 8/2017 | Takahashi et al. | |
| 2002/0130298 | A1 | 9/2002 | Ichiki | |
| 2008/0139436 | A1 | 6/2008 | Reid | |
| 2009/0130849 | A1* | 5/2009 | Lee | B24B 37/044 438/693 |
| 2011/0089539 | A1 | 4/2011 | Akram et al. | |
| 2013/0172225 | A1 | 7/2013 | Phenis et al. | |
| 2014/0135246 | A1* | 5/2014 | Mizutani | C11D 7/261 510/176 |
| 2015/0111804 | A1 | 4/2015 | Dory et al. | |

FOREIGN PATENT DOCUMENTS

| EP | 0 409 403 | 1/1991 | ............... C09D 5/08 |
| JP | H 9-96911 | 4/1997 | ............... G03F 7/42 |
| JP | H 9-258427 | 10/1997 | ............... G03F 1/08 |
| JP | H 9-319098 | 12/1997 | ............... G03F 7/42 |

(Continued)

OTHER PUBLICATIONS

The Supplementary European Search Report for European Application No. EP 16 83 3562 dated Jun. 1, 2018 (10 pages).
International Search Report for PCT/US2016/044423 dated Oct. 4, 2016. 1 page.
Lamaka et al., High effective organic corrosion inhibitors for 2024 aluminium alloy, Electrochimica Acta 52, May 31, 2007, pp. 7231-7247.
The Japanese Office Action for Japanese Application No. JP 2018-506163 dated Feb. 25, 2020 (with English Translation).

(Continued)

*Primary Examiner* — Gregory E Webb
(74) *Attorney, Agent, or Firm* — Fish & Richardson P.C.

(57) ABSTRACT

This disclosure relates to a composition (e.g., a cleaning and/or stripping composition) containing (a) 0.5-25 percent by weight an alkaline compound; (b) 1-25 percent by weight an alcohol amine compound; (c) 0.1-20 percent by weight a hydroxylammonium compound; (d) 5-95 percent by weight an organic solvent; (e) 0.1-5 percent by weight a corrosion inhibitor compound; and (f) 2-25 percent by weight water.

40 Claims, No Drawings

(56) References Cited

FOREIGN PATENT DOCUMENTS

| JP | 2002-515537 | 5/2002 | ............... | C11D 1/62 |
|----|-------------|--------|---|-----------|
| JP | 2002-196510 | 7/2002 | ............... | G03F 7/42 |
| JP | 2006-96984 | 4/2006 | ............... | C11D 7/32 |
| JP | 2009-217267 | 9/2009 | ............... | G03F 7/42 |
| JP | 2010-537231 | 12/2010 | ............... | G03F 7/42 |
| JP | 2011-94100 | 5/2011 | ............... | C11D 7/10 |
| JP | 2015-79244 | 4/2015 | ............... | G03F 7/42 |
| TW | 191238 | 1/1991 | ............... | C09D 5/08 |
| TW | 200946621 | 11/2009 | ............... | C09G 1/02 |
| WO | WO 2015/084921 | 6/2015 | ............... | B08B 3/04 |

Taiwan Office Letter and Search Report for Taiwan Application TW 105124418 dated Dec. 5, 2019 and English summary.
The Office Action for Chinese Application No. 201680044375.5 dated Sep. 3, 2019 with Machine Translation.

* cited by examiner

CLEANING COMPOSITION

CROSS-REFERENCE TO RELATED APPLICATION APPLICATIONS

The present application is a U.S. National Phase Application under 35 U.S.C. § 371 of International Application PCT/US2016/044423, filed on Jul. 28, 2016, which claims the benefit of U.S. Provisional Application Ser. No. 62/200, 236, filed on Aug. 3, 2015. The contents of the parent applications are incorporated herein by references in their entireties.

BACKGROUND OF THE DISCLOSURE

During laser ablation of polymeric films, debris is invariably formed and the amount and type depends on the composition of the film and processing conditions of ablation. This debris is mostly deposited on the terrace but some can find way to the structure's bottom and walls. Thorough removal is essential to enable further component build steps such as soldering and metal deposition. Chemical cleaning of such debris without affecting the film is one of the focuses of the present invention. Moreover, the design of the compositions of the present invention allows the compositions to act as an efficient stripper at an elevated temperature.

SUMMARY OF THE DISCLOSURE

The present disclosure describes a cleaning composition for a post laser ablation cleaning process at room temperature (e.g., 25° C.), which can also serve as a stripping composition for a polymeric layer for either a rework process and/or after subsequent processing at an elevated temperature (e.g., 65-85° C.).

In some embodiments, the composition comprises (or consists essentially of or consists of): (a) 0.5-25 percent by weight an alkaline compound; (b) 1-25 percent by weight an alcohol amine compound; (c) 0.1-20 percent by weight a hydroxylammonium compound (d) 5-95 percent by weight an organic solvent; (e) 0.1-5 percent by weight a corrosion inhibitor compound; and (f) 2-25 percent by weight water.

In some embodiments, this disclosure features a composition that comprises (or consists essentially of or consists of): (a) an alkaline compound; (b) an alcohol amine compound; (c) a hydroxylammonium compound; (d) an organic solvent; (e) a corrosion inhibitor compound; and (f) water, wherein the pH of the composition is at least about 12, and the organic solvent has a relative energy difference (RED) of from about 0.5 to about 0.8 relative to water. In such embodiments, the composition can have a kinematic viscosity at 25° C. from about 5 cSt to about 12 cSt.

The present disclosure also describes a method for post laser ablation cleaning and a method for stripping of polyimide or polyimide precursor compositions.

A unique aspect in the design of the composition of this disclosure is that at room temperature, this composition acts as a cleaner to remove post laser ablation debris, and at elevated temperature acts as an extremely efficient stripper.

DETAILED DESCRIPTION OF THE DISCLOSURE

Some embodiments of this disclosure relate to compositions suitable for cleaning residues after a laser ablation process, and under different treatment conditions, also suitable for stripping a polymeric layer. When used as a cleaning composition after the post laser ablation process, it is essential that little, if any, of the polymeric layer on a semiconductor substrate be removed. When used in a stripping process, it is critical that all of the polymeric layer be removed and the underlying substrate be clean. The inventors discovered unexpectedly that the compositions described herein can be used effectively in both cleaning and stripping processes described above.

In some embodiments, the cleaning/stripping compositions described herein include: (a) 0.5-25 percent by weight an alkaline compound; (b) 1-25 percent by weight an alcohol amine compound; (c) 0.1-20 percent by weight a hydroxylammonium compound; (d) 5-95 percent by weight an organic solvent; (e) 0.1-5 percent by weight a corrosion inhibitor compound; and (f) 2-25 percent by weight water.

The alkaline compounds (a) that can be used in the cleaning/stripping composition of the disclosure are not particularly limited. In some embodiments, the alkaline compounds include inorganic bases, such as, potassium hydroxide, sodium hydroxide, sodium carbonate, sodium bicarbonate, potassium carbonate, and potassium bicarbonate; and organic bases, such as, quaternary ammonium hydroxides. Preferred alkaline compounds are quaternary ammonium hydroxides. Examples of the quaternary ammonium hydroxides include, but are not limited to, quaternary ammonium hydroxides, which can be selected from a group consisting of tetramethyl ammonium hydroxide (TMAH), 2-hydroxyltrimethyl ammonium hydroxide, tetraethyl ammonium hydroxide (TEAH), tetrapropyl ammonium hydroxide (TPAH), tetrabutyl ammonium hydroxide (TBAH), and a mixture thereof. The preferred quaternary ammonium hydroxides are tetramethyl ammonium hydroxide and 2-hydroxyltrimethyl ammonium hydroxide. A more preferred quaternary ammonium hydroxide is tetramethyl ammonium hydroxide.

The alkaline compounds (a) used in the cleaning/stripping composition of this disclosure are present in an amount of at least about 0.5 weight % (e.g., at least about 1 weight %, at least about 2.5 weight % or at least about 5 weight %) to at most about 25 weight % (e.g., at most about 20 weight %, at most about 17.5 weight %, at most about 15 weight %, at most about 12.5 weight %, or at most about 10 weight %) relative to the total amount of the composition of the disclosure.

The alcohol amine compounds (b) used in the cleaning/stripping composition of this disclosure are not particularly limited. These alcohol amine compounds include, but are not limited to, monoethanolamine (MEA), diethanolamine, triethanolamine, 2-(2-aminoethoxy)ethanol, 3-amino-1-propanol, amino-2-propanol, 2-amino-1-butanol, 5-amino-1-pentanol, 2-amino-2-methyl-1-propanol, 3-methylamino-1-propanol, 4-amino-1-butanol, tris(hydroxymethyl)amino ethane, 1-dimethylamino-2-propanol, 1-amino-1-cyclopentanemethanol, monoisopropanolamine, diisopropanolamine, triisopropanolamine, 2-isopropylamino ethanol, 2-propylamino ethanol, 2-(tert-butylamino)ethanol, 5-amino-2,2-dimethyl pentanol, 2-amino-3-methyl-1-butanol, N-methyl-aminoethanol, N-methyldiethanolamine, N-ethylethanolamine, N-butyl ethanolamine, N,N-dimethylethanolamine, N,N-diethylethanolamine, N,N-dibutylethanolamine, N-methyl-N-ethyl ethanolamine and a mixture of two or more of these alcohol amines.

The alcohol amine compounds (b) used in the cleaning/stripping composition of this disclosure are present in an amount of at least about 1 weight % (e.g., at least about 2 weight %, at least about 3 weight % or at least about 4 weight %) to at most about 25 weight % (e.g., at most about 22.5 weight %, at most about 20 weight %, at most about 17.5 weight % at most about 15 weight %, at most about 12.5 weight %, at most about 10 weight %, at most about 7.5 weight %, or at most about 5 weight %) relative to the total amount of composition.

The hydroxylammonium compounds (c) that can be used in the cleaning/stripping composition of this disclosure are not particularly limited. The examples of hydroxylammonium compounds include but are not limited to hydroxylammonium sulfate, hydroxylammonium hydrochloride, hydroxylammonium nitrate, hydroxylammonium phosphate, hydroxyammonium perchlorate, hydroxylammonium citrate, and hydroxylammonium acetate.

The hydroxyl ammonium compounds used in the cleaning/stripping composition of this disclosure are present in an amount of at least about 0.1 weight % (e.g., at least about 0.5 weight %, at least about 1 weight %, at least about 1.5 weight %, or at least about 2 weight %) to at most about 20 weight % (e.g., at most about 17 weight %, at most about 14 weight %, at most about 11 weight %, at most about 8 weight %, or at most about 5 weight %) relative to the total amount of the composition.

The organic solvents (d) (e.g., water miscible organic solvents) in the composition of this disclosure can include those highly compatible with water, which are, for example, N-methyl pyrrolidone (NMP), N-ethyl pyrrolidone (NEP), gamma-butyrolactone, methyl ethyl ketone (MEK), dimethyl sulfoxide (DMSO), dimethyl sulfone, dimethylformamide, N-methylformamide, formamide, tetrametyl urea, tetrahydrofurfuryl alcohol (THFA) and a mixture thereof. In some embodiments, the organic solvents are selected from those having a relative energy difference (RED) of at most about 0.8 (e.g., at most about 0.75, at most about 0.7) and/or at least about 0.5 (e.g., at least about 0.55, at least about 0.6, or at least about 0.65) relative to water. RED is the ratio of distance (Ra) between Hansen parameters in Hansen Space and the interaction radius (Ro) in Hansen space. Ra is defined by the following formulation: $(Ra)^2=4(\delta_{d2}-\delta_{d1})^2+(\delta_{p2}-\delta_{p1})^2+(\delta_{h2}-\delta_{h1})^2$ in which $\delta_d$, $\delta_p$ and $\delta_h$ are respectively the energy between dispersion, intermolecular force and hydrogen bonds between molecules. More detail on Hansen parameters can be found in the following reference: "Hansen, Charles (2007). Hansen Solubility Parameters: A user's handbook, Second Edition. Boca Raton, Fla.: CRC Press. ISBN 978-0-8493-7248-3".

In certain embodiments, the organic solvent (e.g., a water miscible organic solvent) may be a glycol ether. The glycol ethers can include glycol mono ($C_1$-$C_6$) alkyl ethers and glycol di($C_1$-$C_6$) alkyl ethers, including but not limited to, ($C_1$-$C_{20}$) alkane diols, ($C_1$-$C_6$) alkyl ethers, and ($C_1$-$C_{20}$) alkane diol di($C_1$-$C_6$)alkyl ethers. Examples of glycol ethers include ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monethyl ether acetate, propylene glycol monomethyl ether, propylene glycol dimethyl ether, propylene glycol monobutyl ether, propylene glycol, monoproply ether, dipropylene glycol monomethyl ether, dipropylene glycol monopropyl ether, dipropylene glycol monoisopropyl ether, dipropylene glycol monobutyl ether, diproplylene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy) ethanol. More typical examples of glycol ethers are propylene glycol monomethyl ether, propylene glycol monopropyl ether, tri(propylene glycol) monomethyl ether and 2-(2-butoxyethoxy) ethanol.

Preferred solvents in the composition of this disclosure are dimethyl sulfoxide (DMSO) and tetrahydrofurfuryl alcohol (THFA). More preferred solvent is tetrahydrofurfuryl alcohol (THFA).

The solvent used in the cleaning/stripping composition of this disclosure is present in an amount of at least about 5 weight % (e.g., at least about 10 weight %, at least about 15 weight %, at least about 20 weight %, at least about 25 weight %, at least about 30 weight %, at least about 35 weight %, at least about 40 weight %, or at least about 45 weight %) to at most about 95 weight % (e.g., at most about 90 weight %, at most about 85 weight %, at most about 80 weight %, at most about 75 weight %, at most about 70 weight %, at most about 65 weight %, at most about 60 weight %, at most about 55 weight % or at most about 50 weight %) relative to the total amount of the composition.

Corrosion inhibitor compounds (e) used in the cleaning/stripping composition of this disclosure include, but are not limited to, aromatic hydroxyl compounds, acetylenic alcohols, carboxyl group containing organic compounds and anhydrides thereof, and triazole compounds.

Examples of aromatic hydroxyl compounds include, but are not limited to, phenol, cresol, xylenol, pyrocatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, amino resorcinol, p-hydroxybenzoic acid, o-hydroxybenzoic acid, 2,4-dihydroxybenzoic acid, 2,5-dihydroxybenzoic acid, 3,4-dihydroxybenzoic acid and 3,5-dihydroxybenzoic acid.

Examples of acetylenic alcohols include, but are not limited to, 2-butyne-1,4-diol, 3,5-dimethyl-1-hexyn-3-ol, 2-methyl-3-butyn-2-ol, 3-methyl-1-pentyn-3-ol, 3,6-dimethyl-4-octyn-3,6-diol, 2,4,7,9-tetramethyl-5-decyne-4,7-diol and 2,5-dimethyl-3-hexyne 2,5-diol.

Examples of carboxyl group containing organic compounds and anhydrides thereof include, but are not limited to, formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, malic acid, citric acid, acetic anhydride and salicylic acid.

Triazole compounds can include triazole, benzotriazole, substituted triazole, and substituted benzotriazole. Examples of triazole compounds include, but are not limited to, 1,2,4-triazole, 1,2,3-triazole, or triazoles substituted with substituents such as $C_1$-$C_8$ alkyl (e.g., 5-methyltriazole), amino, thiol, mercapto, imino, carboxy and nitro groups. Specific examples include benzotriazole, tolyltriazole, 5-methyl-1,2,4-triazole, 5-phenyl-benzotriazole, 5-nitrobenzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, and the like.

In some embodiments, the corrosion inhibitor is an oxime compound of Structure (I):

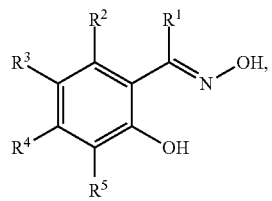
(I)

in which $R^1$ is selected from the group consisting of hydrogen, substituted or unsubstituted $C_1$-$C_{12}$ linear or branched alkyl, substituted or unsubstituted $C_5$-$C_{10}$ cycloalkyl or heterocycloalkyl, and substituted or unsubstituted $C_6$-$C_{12}$ aryl or heteroaryl; and $R^2$ to $R^5$ are each independently selected from the group consisting of hydrogen, halogen, substituted or unsubstituted $C_1$-$C_{12}$ linear or branched alkyl, substituted or unsubstituted $C_5$-$C_{10}$ cycloalkyl or heterocycloalkyl, and substituted or unsubstituted $C_6$-$C_{12}$ aryl or heteroaryl; or any two adjacent $R^2$ to $R^5$ (e.g., $R^2$ and $R^3$, $R^3$ and $R^4$, or $R^4$ and $R^5$), together with the ring carbon atoms to which they are attached, form a six-membered ring.

In some embodiments, $R^1$ is hydrogen, substituted or unsubstituted $C_1$-$C_{12}$ linear or branched alkyl, or substituted or unsubstituted $C_6$-$C_{12}$ aryl. Examples of $R^1$ groups include, but are not limited to, hydrogen, methyl, and phenyl. In some embodiments, each of $R^2$ to $R^5$, independently, is hydrogen, halogen, substituted or unsubstituted $C_1$-$C_{12}$ linear or branched alkyl, substituted or unsubstituted $C_5$-$C_{10}$ cycloalkyl or heterocycloalkyl, or substituted or unsubstituted $C_6$-$C_{12}$ aryl or heteroaryl. Examples of $R^2$-$R^5$ groups include, but are not limited to, hydrogen, halogen, nonyl, dodecyl, phenyl, iso-propyl, t-butyl, cyclopentyl, 1,3-dimethylcyclohexyl, and tolyl. The substituents on the compounds of Structure (I) are chosen to optimize a variety of parameters including, but not limited to, the solubility and activity of the oxime compound in a given composition and the storage stability of the composition.

Examples of suitable compounds of Structure (I) include, but are not limited to,

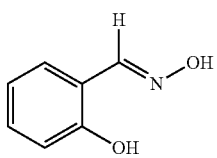
(I-a)

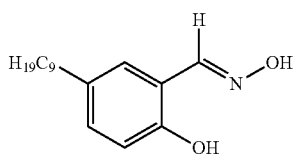
(I-b)

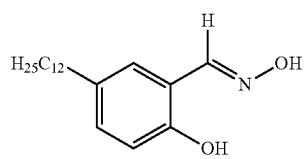
(I-c)

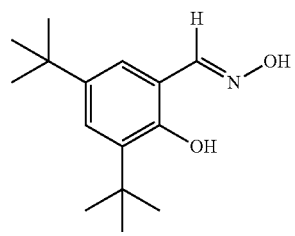
(I-d)

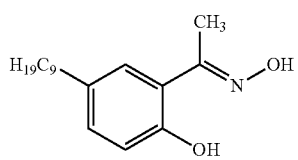
(I-e)

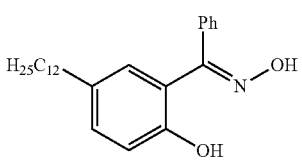
(I-f)

(I-g)

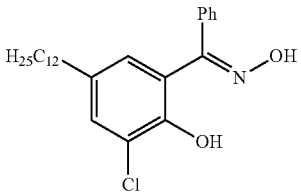
(I-h)

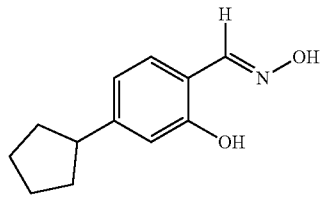
(I-i)

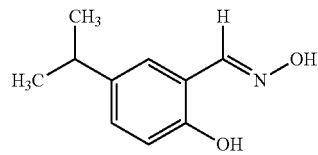
(I-j)

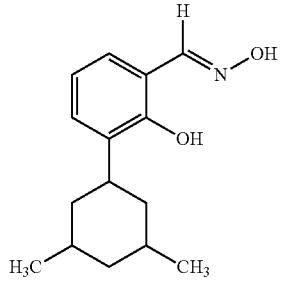
(I-k)

The corrosion inhibitor compound used in the cleaning/stripping composition of this disclosure is present in an amount of at least about 0.1 weight % (e.g., at least about 0.2 weight %, at least about 0.4 weight %, at least about 0.6 weight %, at least about 0.8 weight % or at least about 1 weight %) to at most about 5 weight % (e.g., at most about 4 weight %, at most about 3 weight %, at most about 2 weight %, at most about 1.5 weight %, at most about 1 weight %, at most about 0.5 weight %, or at most about 0.3 weight %) relative to the total amount of the composition. In some embodiments, the preferred amount for the corrosion inhibitor is from 0.2 weight % to 0.4 weight % relative to the total amount of the composition.

The amount of water (such as deionized water, pure water, ultrapure water, etc.) used in the cleaning/stripping composition of this disclosure is at least about 2 weight % (e.g., at least about 4 weight %, at least about 6 weight % or at least about 8 weight %) to at most about 25 weight % (e.g., at most about 20 weight %, at most about 17.5 weight %, at most about 15 weight %, at most about 12.5 weight % or at most about 10 weight %) relative to the total amount of the composition.

The cleaning/stripping composition of the present disclosure may also include one or more of the following additives provided that these additives do not adversely affect the stripping and/or cleaning performance of the composition, nor damage the underlying substrate surface: surfactants, chelating agents, coupling agent, chemical modifiers, dyes, biocides, and/or other additives in amounts up to a total of 5 percent by weight based on the total weight of the composition.

Suitable surfactants in the cleaning/stripping composition of this disclosure include, without limitation: fluoroalkyl surfactants; polyethylene glycols; polypropylene glycols; polyethylene glycol ethers; polypropylene glycol ethers; carboxylic acid salts; dodecylbenzenesulfonic acid and salts thereof; polyacrylate polymers; dinonylphenyl polyoxyethylene; silicone polymers; modified silicone polymers; acetylenic diols; modified acetylenic diols, alkylammonium salts; modified alkylarnmonium salts; alkylammonium suflonic acid inner salts and combinations of two or more of the foregoing. Examples of suitable surfactants include, but are not limited to, the surfactants described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988, which are hereby incorporated by reference.

Examples of chelating agents include, but are not limited to, ethylenediaminetetraacetic acid (EDTA), hydroxyethylethylenediaminetriacetic acid (HEDTA), penicillamine, 2,3-dimercapto-1-propanesulfonic acid (DMPS), dimercaptosuccinic acid (DMSA), gluconic acid, acrylic acid, nitrilotriacetic acid (NTA), glutamic acid diacetic acid (GLDA; DISSOLVINE® GL from AkzoNobel, Chicago, Ill.), tetrasodium iminodisuccinate, iminosuccinic acid, pentasodium diethylenetriamine pentacetate, and polyaspartate. For example, the chelating agent can be EDTA.

The cleaning/stripping composition of this disclosure can further include a coupling agent. A coupling agent may aid in stabilization of the composition, such as maintaining shelf life. Examples of coupling agents include, but are not limited to, sodium xylene sulfonate (SXS), sodium cumene sulfonate (SCS), and ethyl hexyl sulfonate (EHS). In certain embodiments, the coupling agent is sodium xylene sulfonate.

In some embodiments, one or more of the following materials may be excluded from the cleaning/stripping compositions of this disclosure. Examples include active fluorine containing compounds which hydrolyses to release fluorine (e.g. latent HF sources such as carboxyl fluorides), fluoride salts such as ammonium or quaternary ammonium fluorides, oxidizing reagents such as peroxides and inorganic oxidizing agents, amidine salts such as guanidinium salt, acetamidinium salt, and formamidinium salt, urea and urea derivatives, and phenolic compounds.

The cleaning/stripping composition of this disclosure can have a basic pH. The pH can be at least about 12 (e.g., at least about 12.2, at least about 12.4, at least about 12.6, at least about 12.8, at least about 13, at least about 13.2, at least about 13.4, at least about 13.6, at least about 13.8, or at least about 14) and/or at most about 16.0 (e.g., at most about 15.8, at most about 15.6, at most about 15.4, at most about 15.2, at most about 15.0, at most about 14.8, at most about 14.6, at most about 14.4, or at most about 14). The preferred pH range is from 13.5 to 15.5. The most preferred pH range is from 14 to 15.3. The pH value of the composition can be measured by a pH meter which can be calibrated using standard aqueous buffer solutions. Without wishing to be bound by theory, it is believed that a relatively high pH (i.e., a strong basic condition) can facilitate the composition to remove post laser ablation debris in a cleaning process or remove a polymeric layer in a stripping process. For example, in a cleaning process to remove post laser ablation debris, the basic condition can neutralize acidic species and make them soluble in the aqueous solution. In a stripping process to remove a polymeric layer, the basic condition can facilitate breaking the polymer chains or cross-linking networks and therefore help remove the polymeric layer.

In some embodiments, the cleaning/stripping composition of this disclosure can have a relatively low kinematic viscosity. In some embodiments, the kinematic viscosity of the cleaning/stripping composition in this disclosure can be at least about 5.0 cSt (e.g., least about 5.3 cSt, at least about 5.6 cSt, at least about 6.0 cSt, at least about 6.3 cSt, at least about 6.6 cSt, at least about 7.0 cSt, at least about 7.3 cSt, at least about 7.6 cSt, at least about 8.0 cSt, at least about 8.3 cSt, or at least about 8.6 cSt) and/or at most about 12 cSt (e.g., at most about 11.6 cSt, at most about 11.3 cSt, at most about 11.0 cSt, at most about 10.6 cSt, at most about 10.3 cSt, at most about 10 cSt, at most about 9.6 cSt, at most about 9.3 cSt, or at most about 9.0 cSt). As used herein, kinematic viscosity is measured at 25° C. by using a calibrated Cannon-Fenske Routine viscometer. Without wishing to be bound by theory, it is believed that a composition having a relatively high kinematic viscosity can have a lower cleaning/stripping power at least because the diffusion of active ingredients in the composition into the polymeric layer can have a relatively low rate (compared to a composition having a relatively low kinematic viscosity), which can result in a lower stripping and/or cleaning power.

The cleaning/stripping composition of this disclosure can be prepared by mixing various components in any suitable order using conventional mixing methods. The components may be mixed cold, without the addition of heat.

In some embodiments, the cleaning/stripping composition of this disclosure can be used in processes for cleaning after laser ablation of a polymeric film on a semiconductor substrate. In some embodiments, this composition can be also used in a process for stripping unexposed photosensitive polymeric films, exposed, crosslinked polymeric films, or non-photosensitive polymeric films on semiconductor substrates.

Semiconductor substrates could be circular (such as wafers) or could be panels. In some embodiments, the semiconductor substrate could be a silicon substrate, a copper substrate, an aluminum substrate, a silicon oxide substrate, a silicon nitride substrate, a glass substrate, an organic laminate substrate, or a dielectric material substrate.

The polymeric composition used to form a polymeric film on a semiconductor substrate is not particularly limited except by absorbance of the polymeric film at the particulate wavelength used for laser ablation. The polymeric layer can be a polyimide layer, a polyimide precursor layer, a poly(meth)acrylate layer, a polyurethane layer, a polybenzoxazole layer, a polybenzothiozole layer, a novolac layer, an epoxy layer, a polyamide layer or a polyester layer. The polymeric layer can be photosensitive or non-photosensitive, and can be formed by spin coating, spray coating, roller coating, dip coating of solution containing a polymer composition, or lamination of a photosensitive or non-photosensitive dry film composition using a laminator. The preferred polymeric layers are photosensitive polyimide layer and photosensitive polyimide precursor layer. Photosensitive polyimide compositions or photosensitive precursor compositions that can be used to form such a layer are not particularly limited and include, but are not limited to, the compositions disclosed in U.S. Pat. Nos. 5,449,588, 4,661,435, 8,932,801, US2009202793, U.S. Pat. Nos. 6,160,081, 7,648,815, 6,875,554 and US2014178823, which are hereby incorporated by reference.

In some embodiments, a preferred polymeric composition includes: (a) at least one soluble polyimide polymer optionally with end-capped groups having at least one functional group selected from a substituted or unsubstituted linear alkenyl group (e.g., a $C_2$-$C_6$ linear alkenyl group) and a substituted or unsubstituted linear alkenyl group (e.g., a $C_2$-$C_6$ linear alkynyl group); (b) at least one reactive functional compound (RFC), (c) at least one initiator and; (d) at least one solvent.

Soluble polyimide polymer is defined as a polymer that has 5 wt % or higher solubility in an organic solvent, such as gamma-butyrolactone (GBL), caprolactone, sulfolane, N-methyl-2-pyrrolidone (NMP), N-ethyl-2-pyrrolidone, N-butyl-2-pyrrolidone, N-formylmorpholine, dimethylimidazolidinone, N-methylcaprolactam, N-methylpropionamide, N,N-dimethylacetamide (DMAc), dimethyl sulfoxide (DMSO), N,N-dimethylformamide (DMF), N,N-diethylformamide, diethylacetamide, tetrahydrofurfuryl alcohol (THFA), propylene carbonate, 2-phenoxyethanol, propylene glycol phenyl ether, benzyl alcohol, methyl ethyl ketone (MEK), methyl isobutyl ketone (MIBK), 2-heptanone, cyclopentanone (CP), cyclohexanone, propylene glycol monomethyl ether acetate (PGMEA), ethyl lactate (EL), n-butyl acetate (n-BA), or a mixture thereof.

The reactive functional compound (RFC) in the polymeric composition described herein generally possesses at least one functional group capable of reacting with the optional end-capped functional group on the polyimide polymer (e.g., the end-capped functional group on the polyimide polymer described above) or with another reactive functional group on the polyimide polymer. The RFC can be a monomer or an oligomer. The oligomer can contain many monomer units and is capable of further reactions to be incorporated in the final material. Examples of such monomer units/oligomers are based on one or more of the following types: acrylate, ester, vinyl alcohol, urethane, urea, imide, amide, carboxazole, carbonate, pyranose, siloxane, urea-formaldehyde and melamine-formaldehyde. The RFC generally contains at least one terminal and/or pendant reactive functional group capable of radical, thermal, or acid catalyzed reaction with the at least one functional group selected from a substituted or unsubstituted linear alkenyl group and a substituted or unsubstituted linear alkynyl group on the polyimide polymer. In one embodiment, the reactive functional group on the RFC includes an unsaturated double or triple bond.

Suitable examples of reactive functional groups on the RFC include, but are not limited to, a vinyl group, an allyl group, a vinyl ether group, a propenyl ether group, a (meth)acryloyl group, an epoxy group, a —SiH group and a —SH (thiol) group.

In one embodiment, a suitable example of an RFC includes, but is not limited to, an urethane acrylate oligomer. The term "urethane acrylate oligomer" refers to a class of compounds that contain urethane linkages and have (meth)acrylate (e.g., acrylate or methacrylate) functional groups such as urethane multi(meth)acrylate, multiurethane (meth)acrylate, and multiurethane multi(meth)acrylate. Types of urethane (meth)acrylate oligomers have been described by, for example, Coady et al., U.S. Pat. No. 4,608,409 and Chisholm et al., U.S. Pat. No. 6,844,950, which are hereby incorporated by reference. Other specific examples of RFC include 1,6-hexanediol di(meth)acrylate, tetraethyleneglycol di(meth)acrylate, divinylbenzene, ethoxylated bisphenol-A-di(meth)acrylate, diethylene glycol bis(allyl carbonate), trimethylolpropane tri(meth)acrylate, ditrimethylolpropane tetra(meth)acrylate, pentaerythritol tri(meth)acrylate, pentaerythritol tetra(meth)acrylate, di pentaerythritol penta-/hexa-(meth)acrylate, isocyanurate tri(meth)acrylate, bis(2-hydroxyethyl)-isocyanurate di(meth)acrylate, 1,3-butanediol tri(meth)acrylate, 1,4-butanediol tri(meth)acrylate, methyl (meth)acrylate, butyl (meth)acrylate, cyclohexyl (meth)acrylate, benzyl(meth)acrylate, neopentyl glycol di(meth)acrylate, (meth)acrylate modified-urea-formaldehyde resins, (meth)acrylate modified melamine-formaldehyde resins and (meth)acrylate modified cellulose.

In some embodiments, RFC compounds are silicon containing di(meth)acrylate compounds.

Examples of RFC compounds containing thiol groups include, but are not limited to, trimethylolpropane tris(mercaptoacetate), pentaerythritol tetrakis(mercaptoacetate), dipentaerythritol hexakis(3-mercaptopropionate), and ethoxylated trimethylolpropane tri-3-mercaptopropionate. Examples of RFC compounds containing vinyl ether groups include, but are not limited to, 1,4-butanediol divinyl ether, 1,4-cyclohexanedimethanol divinyl ether, di(ethylene glycol) vinyl ether, poly(ethylene glycol) divinyl ether, and bis[4-(vinyloxy)butyl] (4-methyl-1,3-phenylene)biscarbamate. One example of a RFC compound containing a SiH group is octasilane POSS® SH1310 available from Hybrid Plastics.

The initiator (e.g., photoinitiator) in component (c) used in a polymeric composition is a compound that is capable of initiating a reaction between a functional group on the polyimide polymer and the reactive functional compound, when the composition or a portion of the composition is exposed to light and/or heat. Some initiators used in the composition function by generating free radicals when heated or by absorbing light at the wavelength of exposure. Other initiators used in the composition function by generating acid when heated or by absorbing light at the wavelength of exposure. Other initiators used in the composition function by generating a basic compound when heated or by absorbing light at the wavelength of exposure. In some embodiments, the initiators described herein can also catalyze the reaction between a functional group on the polyimide polymer and the reactive functional compound and therefore also serves as a catalyst.

Specific examples of initiators that generate free radicals when heated include, but are not limited to, peroxides (such as benzoyl peroxide, cyclohexanone peroxide, lauroyl peroxide, tert-amyl peroxybenzoate, tert-butyl hydroperoxide, dicumyl peroxide, cumene hydroperoxide, succinic acid peroxide, or di(n-propyl)peroxydicarbonate), azo compounds (e.g., 2,2-azobis(isobutyronitrile), 2,2-azobis(2,4-dimethylvaleronitrile), dimethyl-2,2-azobisisobutyrate, 4,4-azobis(4-cyanopentanoic acid), azobiscyclohexanecarbonitrile, or 2,2-azobis(2-methylbutyronitrile)), α-hydroxy ketones (e.g., 1-hydroxy-cyclohexyl-phenyl-ketone (Irgacure 184)) and mixtures thereof.

A patterned polymeric film containing opening vias in said polymeric film can be formed by irradiating said polymeric film with a laser beam. This process is called laser drilling or laser ablation. Direct laser ablation with a laser beam is a dry, one step material removal according to the mask pattern of fine via with high aspect ratio. This technique is commonly used in industry. In some embodiments, laser ablation can be accomplished using one or more mask based projection excimer lasers. In some embodiments, this process can be done by a maskless direct ablation solid state laser. In some embodiments, the wavelength of the laser is 355 nm or less. In some embodiments, the wavelength of the laser is 308 nm or less. Examples of suitable laser ablation methods include, but are not limited to, the methods described in U.S. Pat. Nos. 7,598,167, 6,667,551, and 6,114,240, which are hereby incorporated by reference.

A by-product of said laser ablation process is a residue or dust (debris) that is generated as a result of the laser ablation process. The debris accumulates in the side walls and bottom of vias. It also accumulates on the mirrors and optics of the laser imaging device. This can have adversely effects on the performance of the laser ablation process. A vacuum device fitted into an imager may capture a significant amount of residues on optics and mirror. Several techniques are used for post laser ablation cleaning of vias. These techniques includes using a sacrificial layer, solvent cleaning, oxygen plasma cleaning, CO2 snow cleaning and DPSS cleaning (diode pump solid state) using pico second DPSS laser. Examples of suitable post laser ablation cleaning methods include, but are not limited to, the methods described in U.S. Pat. No. 7,994,450, US20120168412, US20020170894, US20030052101, and U.S. Pat. No. 8,716,128, which are hereby incorporated by reference.

In one embodiment, the method for manufacturing a semiconductor device comprises the steps of (i) exposing a polymeric film to a laser under ablating conditions, and (ii) cleaning the laser ablation debris using one or more of the compositions of the disclosure.

The polymeric composition is not particularly limited except by absorbance of the polymeric film at the particulate wavelength used for laser ablation. The ability of the material to absorb laser energy limits the depth to which that energy can perform useful ablation. Ablation depth is determined by, for example, the absorption depth of the material and the heat of vaporization of the work material. The depth is also a function of beam energy density, the laser pulse duration, and the laser wavelength. Laser energy per unit area on the work material is measured in terms of the energy fluence. In one embodiment, the polymeric composition can be adjusted to have absorbance from 0.007 per micron to 0.015 per micron at 248 nm. In another embodiment, the polymeric composition can be adjusted to have absorbance from 0.6 per micron to 0.9 per micron at 308 nm. In yet another embodiment, the polymeric composition can be adjusted to have absorbance from 0.1 per micron to 0.2 per micron at 355 nm. In some embodiments, the amount of absorption can be adjusted by addition of a dye. In all these three embodiments, energy fluence is at most 2000 mJ/cm$^2$ (e.g., at most 1900 mJ/cm$^2$, at most 1800 mJ/cm$^2$, at most 1700 mJ/cm$^2$ or at most 1600 mJ/cm$^2$) and/or at least 1200 mJ/cm$^2$ (e.g., 1300 mJ/cm$^2$, at least 1400 mJ/cm$^2$ or at least 1500 mJ/cm$^2$). The film thickness of the polymeric layer formed by such a polymeric composition can be at least about 1 micron (e.g., at least about 2 microns, at least about 5 microns, at least about 10 microns, at least about 15 microns, at least about 20 microns, at least about 25 microns, at least about 30 microns, at least about 35 microns, at least about 40 microns or at least about 45 microns) to at most about 80 microns (e.g., at most about 75 microns, at most about 70 microns, at most about 65 microns, at most about 60 microns, at most about 55 microns or at most about 50 microns).

The post laser ablation cleaning process can be accomplished by treating the object to be cleaned with the compositions of this disclosure using known techniques, such as immersion, centrifugal spray, megasonic cleaning and ultrasonic cleaning. Examples of such cleaning procedures are disclosed in U.S. Pat. Nos. 6,766,813, 5,100,476 and 5,368,054, which are hereby incorporated by reference.

Temperatures employed in the cleaning process can be at least about 15° C. (e.g., at least about 16° C., at least about 17° C., at least about 18° C., at least about 19° C., at least about 20° C., at least about 21° C., at least about 22° C., or at least about 23° C.) and/or at most about 30° C. (e.g., at most about 29° C., at most about 28° C., at most about 27° C., at most about 26° C. or at most about 25° C.). Time employed in the cleaning process can be at least about 2 minutes (e.g., at least about 4 minutes or at least about 5 minutes) and at most about 10 minutes (e.g., at most about 8 minutes or at most about 6 minutes).

Optional steps in the cleaning process include rinsing and drying steps. The semiconductor substrate may be rinsed with water or an aqueous solution. Aqueous solutions that can be used in this process could be a mixture of DI-water and a surfactant, a slightly basic aqueous solution containing a surfactant, or an aqueous solution containing linear or branched C1-C4 alcohols to remove the composition described in this disclosure and/or other residues. This step can also be accomplished by using known techniques such as immersion, centrifugal spray, megasonic cleaning and ultrasonic cleaning. The cleaned semiconductor substrate can be dried using drying means known to those skilled in the art.

Surprisingly, the composition described in this disclosure shows unexpected effectiveness on completely removal of post laser ablation debris from said patterned polymeric film at a low temperature without any damage to said film.

In some embodiments, at elevated temperature, the compositions of this disclosure can also be used in a process for stripping unexposed photosensitive polymeric films, exposed, crosslinked polymeric films, or non-photosensitive polymeric films from semiconductor substrates. Stripping processes can be accomplished by treating the object from which the polymeric film is to be stripped using known techniques, such as immersion, centrifugal spray, megasonic cleaning and ultrasonic cleaning.

Temperatures employed in the stripping process can be at least about 65° C. (e.g., at least about 67° C. or at least about 70° C.) to at most about 85° C. (e.g., at most about 80° C. or at most about 75° C.). The stripping time can be at least about 15 minutes (e.g., at least about 30 minutes, at least about 40 minutes, at least about 50 minutes, or at least about 60 minutes) and/or at most about 120 minutes (e.g., at most about 110 minutes, at most about 100 minutes, at most about 90 minutes, at most about 80 minutes, or at most about 70 minutes).

Optional steps in the stripping process include rinsing and drying steps as described above in the cleaning process.

A unique aspect in the design of the compositions of the disclosure is that the compositions of this disclosure can act as a cleaner for post laser ablation debris at room temperature and can act as an extremely efficient strippers for complete stripping of non-ablated areas of polymeric film at an elevated temperature.

One embodiment of the current disclosure features a method for manufacturing a semiconductor device. This method can be performed for example, by (i) patterning a photosensitive polymeric layer (e.g., a layer containing a polyimide polymer or a polyimide precursor polymer) on top of a substrate (e.g., formed by coating the substrate with a polymeric composition) to form a pattered polymeric layer, (ii) treating the patterned substrate with ion implantation (e.g., to form a transistor), plasma or wet etching (e.g., to form a pattern in a photosensitive polymeric layer), or metal deposition (e.g., to form electrically conductive connection between devices), and (iii) stripping said polymeric layer using a composition described herein. Each of the above three steps can be performed by methods known in the art. In some embodiments, the polymeric layer can be formed by a polyimide composition or a polyimide precursor composition. In some embodiments, the polyimide composition or polyimide precursor composition can be photosensitive.

One embodiment of present disclosure features a process including: (i) providing semiconductor substrate containing a polymeric film; (ii) optionally flood exposing said polymeric film by using light, or other radiation sources; (iii) optionally subjecting said polymeric film after the light-exposure treatment to a post-exposure baking treatment; (iv) optionally subjecting the post exposure baked polymeric film to hard bake; (v) opening vias into said polymeric film by a laser ablation process using a laser to form a patterned polymeric film; (vi) removing post laser ablation debris from said patterned polymeric film using a cleaning/stripping composition of this disclosure, (vii) forming a conductive post in a region including an inner side of vias by applying a molten conductive paste on vias; (viii) optionally rinsing the patterned polymeric film with a conductive paste remover solution to remove the conductive paste from top of polymeric film, (ix) removing non-ablated areas of polymeric film using a cleaning/stripping composition of this disclosure at an elevated temperature, and (x) optionally, rinsing the patterned polymeric film with water or an aqueous solution to remove any remaining cleaning/stripping composition of this disclosure and other residues. The cleaning/stripping composition used in the cleaning step (vi) can be the same as or different from the cleaning/stripping composition used in the stripping step (ix).

In some embodiments of this process, the polymeric film is photosensitive. In some embodiments, the photosensitive film is negative tone. In some embodiments, the photosensitive negative tone film is formed from a polyimide composition or a polyimide precursor composition.

In some embodiments of this process, a photosensitive polymeric coated substrate is exposed to radiation in step (ii). The exposure is typically a flood exposure, done under non-ablating conditions. In general, this exposure step results in the curing or crosslinking of the photosensitive polymeric coating in the exposed area. This exposure step uses light, or other radiation sources (e.g., ultraviolet light, visible light, electron beam radiation, or X-rays), as is suitable for the initiator in the specific polymeric composition. The use of i-line (365 nm), h-line (405 nm), or g-line (436 nm) UV light is preferred. One skilled in the art will know which type of high energy radiation is appropriate for a given application. The energy dose used in the present disclosure can be at least about 200 mJ/cm$^2$ (e.g., at least about 300 mJ/cm$^2$, at least about 400 mJ/cm$^2$, at least about 500 mJ/cm$^2$, at least about 600 mJ/cm$^2$, at least about 700 mJ/cm$^2$ or at least about 800 mJ/cm$^2$) to at most about 2000 mJ/cm$^2$ (e.g., at most about 1800 mJ/cm$^2$, at most about 1600 mJ/cm$^2$, at most about 1400 mJ/cm$^2$, at most about 1200 mJ/cm$^2$ or at most about 1000 mJ/cm$^2$).

In some embodiments, a short post exposure bake is performed. The post exposure baking temperature can be at least about 50° C. (e.g., at least about 60° C., at least about 70° C. or at least about 80° C.) and/or at most about 120° C. (e.g., at most about 110° C., at most about 100° C., at most about 100° C. and at most about 90° C.). The post exposure baking time can be at least about 120 seconds (e.g., at least about 150 seconds or at least about 180 seconds) and/or at most about 300 seconds (e.g., at most about 270 seconds or at most about 240 seconds).

In some embodiments, a hard baking step can be incorporated. In some embodiments, the hard baking temperature can be at least about 150° C. (e.g., at least about 170° C. or at least about 190° C.) to at most about 250° C. (e.g., at most about 230° C. or at most about 210° C.). The hard baking time can be at least about 30 minutes (e.g., at least about 45 minutes or at least about 60 minutes) and/or at most about 120 minutes (e.g., at most about 105 minutes or at most about 90 minutes).

The laser ablation step and the post laser ablation cleaning step can be done as described earlier.

In the next step of this process, an electrical connection between one surface of the semiconductor substrate and one surface of another substrate can be provided by formation of the conductive layer in the vias produced by laser ablation process. Formation of said conductive layer without having to fill the through-via with a molten material (e.g., a molten conductive paste or solder paste) is one of the possible ways to ensure highly reliable electrical connections. The conducting paste or solder paste include metals or alloys such as nickel, copper, beryllium copper, alloys of nickel, alloys of copper, alloys of beryllium copper, nickel-cobalt-iron alloys and iron-nickel alloys with a polymeric binder. Further details of the composition and application of conductive paste are described in US2013069014, U.S. Pat. Nos. 4,789, 411, 5,204,025, and 7,081,214, which are hereby incorporated by reference. Cleaning compositions for removal of conductive paste after reflow are described in U.S. Pat. Nos. 5,888,308 and 6,277,799, which are hereby incorporated by reference. The cleaning process can be accomplished by using known techniques, such as immersion, centrifugal spray, megasonic cleaning and ultrasonic cleaning as discussed earlier.

The complete removal (stripping) of the polymeric film can be done by using the cleaning/stripping compositions of this disclosure as described above in the stripping process, including the optional rinsing and drying steps.

The cleaned semiconductor substrate is ready for subsequent integration processes to create semiconductor devices, such as semiconductor packages (e.g., memory packages, microprocessor packages, tablets packages and packages that are used for mobile devices). In some embodiments, a semiconductor package can be prepared by a multi-step process that includes at least one step that removes post laser ablation or drilling debris using a cleaning/stripping composition described herein. In some embodiments, a semiconductor package can be prepared by a multi-step process that includes at least one step that strips or removes of a polymeric film using a cleaning/stripping composition described herein.

The disclosure will now be further elucidated with reference to the following non-limiting examples.

Synthesis Example 1 (Poly-1)

hours. A small sample (1 g) was withdrawn and precipitated into 50:50 methanol:water (10 ml). The solid was isolated by filtration and dried. FTIR analysis showed that the imidization reaction was complete (showed absence of amide and anhydride peaks).

The solution was cooled to room temperature and added dropwise to 18 liters of vigorously stirred de-ionized water to precipitate the polymer. The polymer was collected by filtration and washed with one liter of de-ionized water. The cake was re-slurried with four liters of methanol and filtered. The wet cake was dried in air for 12 hours and then the

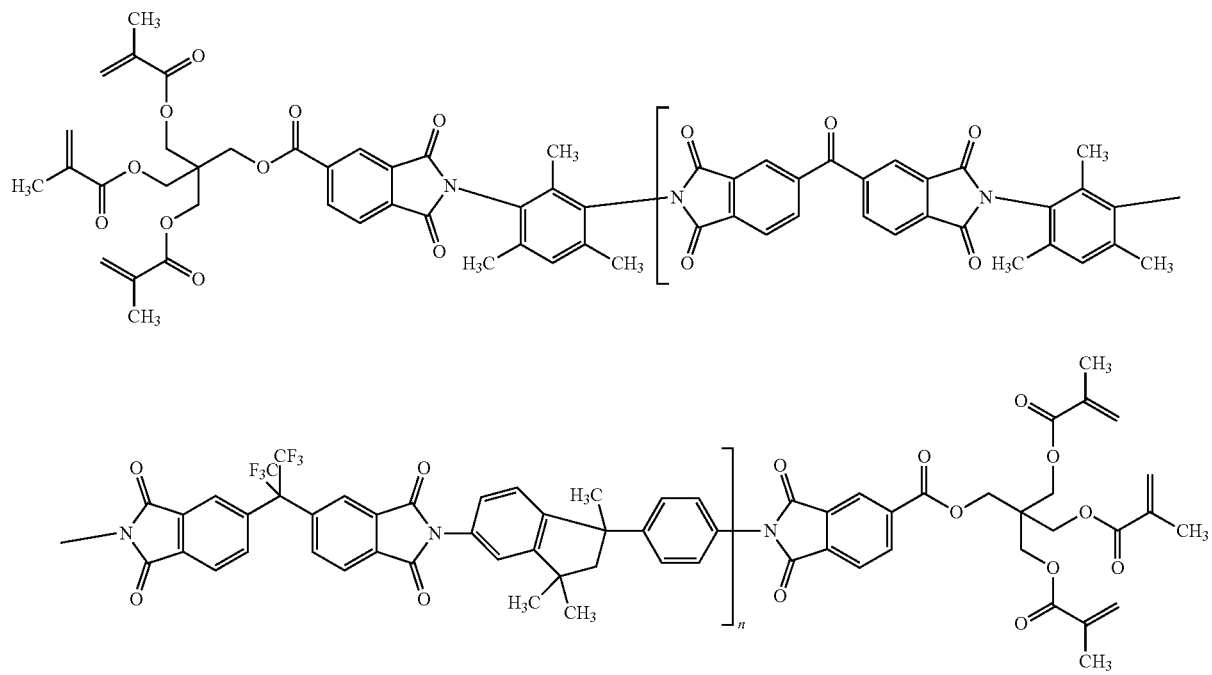

The polymerization reaction was performed in an one liter three-neck, jacketed round bottomed flask equipped with a mechanical agitator, a thermocouple and a nitrogen inlet to keep positive nitrogen pressure throughout the reaction. The flask was charged with 203.7 grams of benzophenone-3,3', 4,4'-tetracarboxylic dianhydride (BTDA), 70.2 grams of hexafluoroisopropylidenediphthalic anhydride (6 FDA) and 300 grams of anhydrous NMP. The contents were agitated at 18-20° C. 106.55 grams of 1-(4-aminophenyl)-1,3,3-trimethylindan-5-amine (DAPI), and 60.4 grams of 2,4-diamino-1,3,5-trimethylbenzene (DAM) were dissolved in 700 grams of dry NMP in a bottle. The diamine solution was added to the flask by pump for 1 hour at room temperature. The mixture was warmed to 60° C. and agitated for 3 hours to produce a polyamic acid.

To endcap the polyamic acid formed above, 16.5 grams of 3-acryloyloxy-2,2-bis[(acryloyloxy)methyl]propyl 1,3-dioxo-1,3-dihydro-2-benzofuran-5-carboxylate (PETA) and 1.58 g of pyridine were charged to the flask. The mixture was agitated at 60° C. for 3 hours to form an endcapped polyamic acid.

To perform the imidization reaction of the above endcapped polyamic acid, 100.0 grams of acetic anhydride and 35.0 grams of pyridine were charged to the flask. The reaction mixture was warmed to 110° C. and agitated for 12 polymer was dried under vacuum at 70° C. for 12 hours. The molecular weight of the resultant polyimide polymer was measured by GPC.

Composition Example 1

Formulation of a Polymer Solution for Preparation of Dry Film (F-1)

To a 3-neck round bottom flask equipped with a mechanical stirrer was added 645 parts of GBL, 205.4 parts of the polymer obtained in Synthesis Example 1, 6.6 parts of (3-glycidyloxypropyl)trimethoxy silane, 6.16 parts of NCI-831 (trade name, available from ADEKA corporation), 4.11 parts of (2,4,6-trimethylbenzoyl)phosphine oxide, 69.32 parts of tetraethylene diacrylate, 23.11 g of pentacrylthritol triacrylate and 30.81 g of polyamic ester of Structure PAE-1. The composition was mechanically stirred for 18 hours. This composition was then filtered by using a 0.2 μm filter (Ultradyne from Meissner Filtration Product, Inc., cat. no. CFTM10.2-4461).

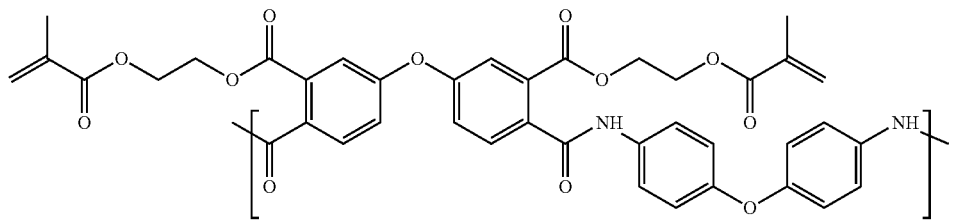

Structure PAE-1

Dry Film Examples DF-1

The filtered photosensitive solution (F-1) was applied via slot-die coater from Frontier Industrial Technologies (Towanda, Pa.) with line speed of 5 feet/minutes (150 cm per minutes) onto a polyethylene terephthalate (PET) film TA 30 (manufactured by Toray Plastics America, Inc.) having a thickness of 36 μm used as a carrier substrate without online corona treatment and dried at 180-200° F. to obtain polymeric layers with thickness of 37 microns. The lamination pressure was 30 psi and the vacuum was 0.7 Torr. On this polymeric layer, a biaxially oriented polypropylene (BOPP) films (manufactured by IMPEX GLOBAL LLC, trade name 80ga BOPP) was laminated by a roll compression to act as a protective layer.

Lamination of Dry Film Examples (L-1)

After the removal of the protective layer by peeling, the polymeric layer of dry film structure DF-1 (6"×6") was placed on a 4" copper wafer (Wafernet). The polymeric layer was laminated onto Cu coated wafer by vacuum lamination at 80° C. followed by being subjected to a pressure of 25 psi. Lamination process was done by using a DPL-24A Differential Pressure Laminator manufactured by OPTEK, NJ.

Lamination of Dry Film Examples (L-2)

After the removal of the protective layer by peeling, the polymeric layer of dry film structure DF-1 (12"×12") was placed on an 8" copper wafer (Wafernet, item # S45102). The polymeric layer was laminated onto Cu coated wafer by vacuum lamination at 80° C. followed by being subjected to a pressure of 25 psi. Lamination process was done by using a DPL-24A Differential Pressure Laminator manufactured by OPTEK, NJ.

Laser Ablation of Dry Film Examples (LA-1)

Laminated dry film (L-2) was flood exposed at 1000 mJ/cm$^2$ using SUSS broad band exposure tool. The wafer was then heated at 50° C. for 180 seconds. The laminated dry film was then baked at 220° C. for one hour under vacuum.

The laser ablation procedure was performed on exposed, baked wafer by EPL300 Gen2 at wavelength of 308 nm using a via mask with a via diameter of 65 microns and pitch of 90 microns. The printing energy of 308 nm laser was fixed at 800 mJ/cm$^2$ and N=60 pulse.

Examples of Cleaning/Stripping Composition

A composition was prepared by using 2.5 parts of tetramethyl ammonium hydroxide (TMAH), 4.3 parts of monoethanolamine, 0.5 parts of hydroxylammonium sulfate, 85 parts of tetrahydrofurfuryl alcohol (THFA), 0.2 parts of 5-methyl-1H-benzotriazole and 7.5 prats of water. The pH of this cleaning/stripping composition was measured at 14.9 by using a Metrohm Model 716 base unit equipped with a Metrohm pH Electrode part #6.0233/100. Kinematic viscosity of the cleaning/stripping composition was measured by using a Cannon Fenske viscometer size 150 at 25° C. The kinematic viscosity was 8.5 cSt.

Examples of Cleaning Procedure

The laminated wafer LA-1 was cut into 1"×2" pieces and placed vertically in a 600 mL beaker containing 300 mL of the cleaning/stripping composition obtained above. The contents of the beaker were stirred using a magnetic bar at 25° C. The temperature was maintained constant by using a temperature controller. After 5 minutes, the wafer pieces were removed and immediately rinsed with water and dried by using nitrogen purge. The effectiveness of cleaning was determined by using an optical microscope and by SEM after gold sputtering. Both top-down and cross-section Images of wafer revealed no residue after cleaning. The extent of film thickness loss was determined by measuring the thickness of the remaining film using Dektak profilometer. Ablation debris was completely removed without any damage to film. No film thickness loss was observed.

Examples of Stripping Procedure

The laminated wafer LA-1 was cut into 1"×2" pieces and placed vertically in a 600 mL beaker containing 300 mL of the cleaning/stripping composition obtained above. The contents of the beaker were stirred using a magnetic bar at 85° C. The temperature was maintained constant by using a temperature controller. After 60 minutes, the wafer pieces were removed and immediately rinsed with water and dried by using nitrogen purge. The effectiveness of stripping was determined by using an optical microscope and by SEM after gold sputtering. Both top-down and cross-section Images of wafer revealed no residue after cleaning. The extent of film thickness loss was determined by measuring the thickness of the remaining film using Dektak profilometer. Complete stripping of the polymeric layer remaining after laser ablation was observed.

What is claimed is:

1. A composition, comprising:
    (a) 0.5-25 percent by weight an alkaline compound;
    (b) 1-25 percent by weight an alcohol amine compound;
    (c) 0.1-20 percent by weight a hydroxylammonium compound;
    (d) 5-95 percent by weight an organic solvent;

(e) 0.1-5 percent by weight a corrosion inhibitor compound; and
(f) 2-25 percent by weight water;
wherein the composition has a pH of at least about 12.4.

2. The composition of claim 1, wherein the alkaline compound is selected from the group consisting of tetramethyl ammonium hydroxide (TMAH), 2-hydroxyltrimethyl ammonium hydroxide, tetraethyl ammonium hydroxide (TEAH), tetrapropyl ammonium hydroxide (TPAH), tetrabutyl ammonium hydroxide (TBAH), and a mixture thereof.

3. The composition of claim 1, wherein the alcohol amine compound is selected from the group consisting of monoethanolamine (MEA), diethanolamine, triethanolamine, 2-(2-aminoethoxy)ethanol, monoisopropanolamine, diisopropanolamine, triisopropanolamine, N-methyldiethanolamine, N-ethyl ethanolamine, N-butyl ethanolamine, diethanolamine, diglycolamine, 2-(2-aminoethoxy)ethanol, N,N-dimethylethanolamine, N,N-diethylethanolamine, N,N-dibutylethanolamine, N-methyl-N-ethyl ethanolamine and a mixture of thereof.

4. The composition of claim 1, wherein the hydroxylammonium compound is selected from the group consisting of hydroxylammonium sulfate, hydroxylammonium hydrochloride, hydroxylammonium nitrate, and hydroxylammonium phosphate.

5. The composition of claim 4, wherein the hydroxylammonium compound is hydroxylammonium sulfate.

6. The composition of claim 1, wherein the solvent is selected from the group consisting of N-methyl pyrrolidone (NMP), N-ethyl pyrrolidone (NEP), gamma-butyrolactone, methyl ethyl ketone (MEK), dimethyl sulfoxide (DMSO), dimethyl sulfone, dimethylformamide, N-methylformamide, formamide, tametyl urea, tetrahydrofurfuryl alcohol (THFA) and a mixture thereof.

7. The composition of claim 6, wherein the solvent is dimethyl sulfoxide (DMSO) or tetrahydrofurfuryl alcohol (THFA).

8. The composition of claim 1, wherein the corrosion inhibitor compound is triazole, benzotriazole, substituted triazole, or substituted benzotriazole.

9. The composition of claim 8, wherein the corrosion inhibitor compound is 5-methyl-1H-benzotriazole.

10. The composition of claim 9, wherein the amount of the corrosion inhibitor compound is at most about 0.5 weight % of the total composition.

11. The composition of claim 9, wherein the amount of the corrosion inhibitor compound is at most about 0.3 weight % of the total composition.

12. The composition of claim 1, wherein the corrosion inhibitor compound is a compound of Structure (I)

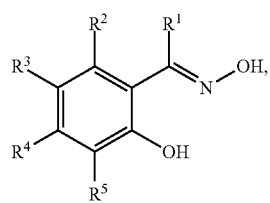

wherein
$R^1$ is selected from the group consisting of hydrogen, substituted or unsubstituted $C_1$-$C_{12}$ linear or branched alkyl, substituted or unsubstituted $C_5$-$C_{10}$ cycloalkyl or heterocycloalkyl, and substituted or unsubstituted $C_6$-$C_{12}$ aryl or heteroaryl; and $R^2$ to $R^5$ are each independently selected from the group consisting of hydrogen, halogen, substituted or unsubstituted $C_1$-$C_{12}$ linear or branched alkyl, substituted or unsubstituted $C_5$-$C_{10}$ cycloalkyl or heterocycloalkyl, and substituted or unsubstituted $C_6$-$C_{12}$ aryl or heteroaryl; or any two adjacent $R^2$ to $R^5$, together with the ring carbon atoms to which they are attached, form a six-membered ring.

13. The composition of claim 12, wherein the corrosion inhibitor compound is

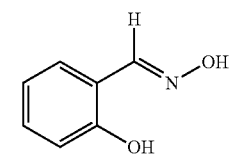

(I-a)

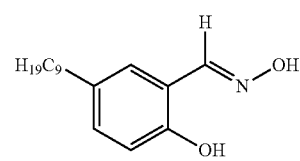

(I-b)

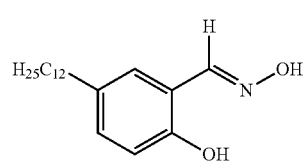

(I-c)

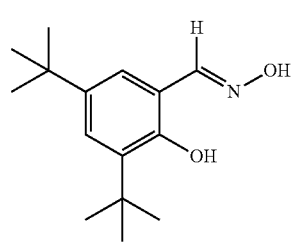

(I-d)

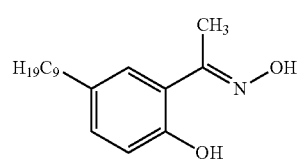

(I-e)

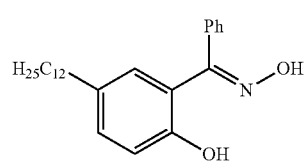

(I-f)

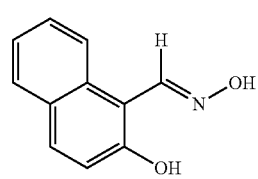

(I-g)

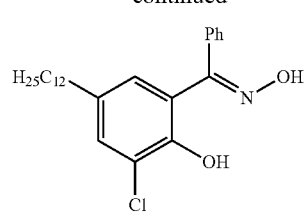

14. A method for manufacturing a semiconductor device, comprising treating an unexposed photosensitive polymeric film, an exposed, crosslinked polymeric film, or a non-photosensitive polymeric film on a semiconductor substrate with a composition at a temperature of about 65° C. to about 85° C.;
wherein the composition comprises (a) 0.5-25 percent by weight an alkaline compound; (b) 1-25 percent by weight an alcohol amine compound; (c) 0.1-20 percent by weight a hydroxylammonium compound; (d) 5-95 percent by weight an organic solvent (e) 0.1-5 percent by weight a corrosion inhibitor compound; and (f) 2-25 percent by weight water.

15. A method for manufacturing a semiconductor device, comprising the steps of:
(i) patterning a photosensitive polymeric film comprising at least one polyimide polymer or a polyimide precursor polymer on top of a semiconductor substrate to form a patterned film;
(ii) treating the patterned film with ion implantation, plasma or wet etching, or metal deposition, and
(iii) stripping said photosensitive polymeric film using a composition comprising (a) 0.5-25 percent by weight an alkaline compound; (b) 1-25 percent by weight an alcohol amine compound; (c) 0.1-20 percent by weight a hydroxylammonium compound; (d) 5-95 percent by weight an organic solvent (e) 0.1-5 percent by weight a corrosion inhibitor compound; and (f) 2-25 percent by weight water.

16. A method for manufacturing a semiconductor device, comprising the steps of (i) exposing a polymeric film to a laser under ablating conditions, and (ii) cleaning the laser ablation debris using a composition comprising (a) 0.5-25 percent by weight an alkaline compound; (b) 1-25 percent by weight an alcohol amine compound; (c) 0.1-20 percent by weight a hydroxylammonium compound; (d) 5-95 percent by weight an organic solvent (e) 0.1-5 percent by weight a corrosion inhibitor compound; and (f) 2-25 percent by weight water.

17. A process, comprising:
(i) providing a semiconductor substrate containing a polymeric film;
(ii) optionally flood exposing said polymeric film by using light, or another other radiation source;
(iii) optionally subjecting said polymeric film after the light-exposure treatment to a post-exposure baking treatment;
(iv) optionally subjecting post exposure baked polymeric film to hard bake;
(v) opening vias into said polymeric film by a laser ablation process using a laser to form a patterned polymeric film;
(vi) removing post laser ablation debris from said patterned polymeric film by using a composition;
(vii) forming a conductive post in a region including an inner side of vias by applying a molten conductive paste on vias;
(viii) optionally rinsing the patterned polymeric film with a conductive paste remover solution to remove the conductive paste from top of polymeric film,
(ix) removing non-ablated areas of the patterned polymeric film using a composition at elevated temperature; and
(x) optionally, rinsing the patterned polymeric film with water or an aqueous solution to remove residues,
wherein each of the compositions used in steps (vi) and (ix) is a composition comprising (a) 0.5-25 percent by weight an alkaline compound; (b) 1-25 percent by weight an alcohol amine compound; (c) 0.1-20 percent by weight a hydroxylammonium compound; (d) 5-95 percent by weight an organic solvent (e) 0.1-5 percent by weight a corrosion inhibitor compound; and (f) 2-25 percent by weight water.

18. The process of claim 17, wherein the substrate is copper and the polymeric film is obtained from a composition comprising: (a) at least one soluble polyimide polymer with end-capped groups having at least one functional group selected from a substituted or unsubstituted linear alkenyl group and a substituted or unsubstituted linear alkynyl group; (b) at least one reactive functional compound (RFC), (c) at least one initiator; and (d) at least one solvent.

19. The process of claim 18, wherein laser ablation is accomplished by using a mask based projection excimer laser.

20. The process of claim 18, wherein the wavelength of the laser is 355 nm or less.

21. The process of claim 18, wherein the wavelength of the laser is 308 nm or less.

22. A semiconductor package prepared by a multi-step process, the multi-step process comprising at least one step comprising removing post laser ablation debris using the composition of claim 1.

23. A semiconductor package prepared by a multi-step process, the multi-step process comprising at least one step comprising stripping of a polymeric film using the composition of claim 1.

24. A composition, comprising: (a) an alkaline compound; (b) an alcohol amine compound; (c) a hydroxylammonium compound; (d) an organic solvent; (e) a corrosion inhibitor compound; and (f) water, wherein the pH of the composition is at least about 12.4, and the organic solvent has a relative energy difference (RED) of from about 0.5 to about 0.8 relative to water.

25. The composition of claim 24, wherein the composition has a kinematic viscosity at 25° C. from about 5 cSt to about 12 cSt.

26. The method of claim 16, wherein the alkaline compound is selected from the group consisting of tetramethyl ammonium hydroxide (TMAH), 2-hydroxyltrimethyl ammonium hydroxide, tetraethyl ammonium hydroxide (TEAH), tetrapropyl ammonium hydroxide (TPAH), tetrabutyl ammonium hydroxide (TBAH), and a mixture thereof.

27. The method of claim 16, wherein the alcohol amine compound is selected from the group consisting of monoethanolamine (MEA), diethanolamine, triethanolamine, 2-(2-aminoethoxy)ethanol, monoisopropanolamine, diisopropanolamine, triisopropanolamine, N-methyl di ethanol amine, N-ethyl ethanol amine, N-butyl ethanolamine, diethanolamine, diglycolamine, 2-(2-aminoethoxy)ethanol, N,N-dimethylethanolamine, N,N-diethylethanolamine, N,N-dibutylethanolamine, N-methyl-N-ethyl ethanolamine and a mixture of thereof.

28. The method of claim 16, wherein the hydroxylammonium compound is selected from the group consisting of hydroxylammonium sulfate, hydroxylammonium hydrochloride, hydroxylammonium nitrate, and hydroxylammonium phosphate.

29. The method of claim 28, wherein the hydroxylammonium compound is hydroxylammonium sulfate.

30. The method of claim 16, wherein the solvent is selected from the group consisting of N-methyl pyrrolidone (NMP), N-ethyl pyrrolidone (NEP), gamma-butyrolactone, methyl ethyl ketone (MEK), dimethyl sulfoxide (DMSO), dimethyl sulfone, dimethylformamide, N-methylformamide, formamide, tetrametyl urea, tetrahydrofurfuryl alcohol (THFA) and a mixture thereof.

31. The method of claim 30, wherein the solvent is dimethyl sulfoxide (DMSO) or tetrahydrofurfuryl alcohol (THFA).

32. The method of claim 16, wherein the corrosion inhibitor compound is triazole, benzotriazole, substituted triazole, or substituted benzotriazole.

33. The method of claim 32, wherein the corrosion inhibitor compound is 5-methyl-1H-benzotriazole.

34. The method of claim 33, wherein the amount of the corrosion inhibitor compound is at most about 0.5 weight % of the total composition.

35. The method of claim 33, wherein the amount of the corrosion inhibitor compound is at most about 0.3 weight % of the total composition.

36. The composition of claim 16, wherein the corrosion inhibitor compound is a compound of Structure (I)

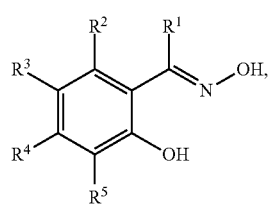

(I)

wherein
$R^1$ is selected from the group consisting of hydrogen, substituted or unsubstituted $C_1$-$C_{12}$ linear or branched alkyl, substituted or unsubstituted $C_5$-$C_{10}$ cycloalkyl or heterocycloalkyl, and substituted or unsubstituted $C_6$-$C_{12}$ aryl or heteroaryl; and
$R^2$ to $R^5$ are each independently selected from the group consisting of hydrogen, halogen, substituted or unsubstituted $C_1$-$C_{12}$ linear or branched alkyl, substituted or unsubstituted $C_5$-$C_{10}$ cycloalkyl or heterocycloalkyl, and substituted or unsubstituted $C_6$-$C_{12}$ aryl or heteroaryl; or any two adjacent $R^2$ to $R^5$, together with the ring carbon atoms to which they are attached, form a six-membered ring.

37. The method of claim 36, wherein the corrosion inhibitor compound is

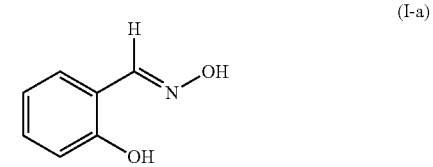

(I-a)

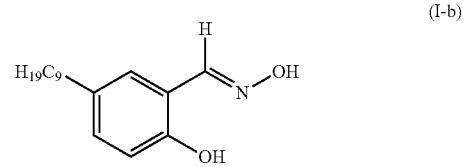

(I-b)

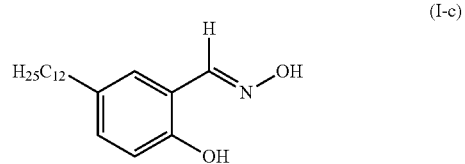

(I-c)

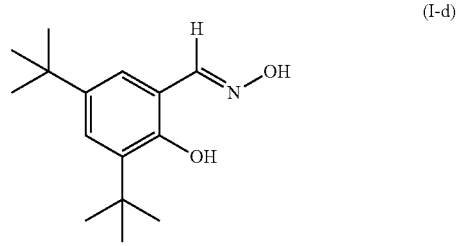

(I-d)

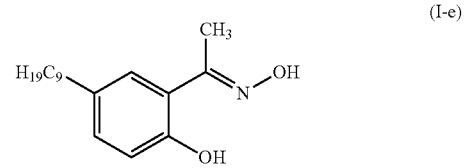

(I-e)

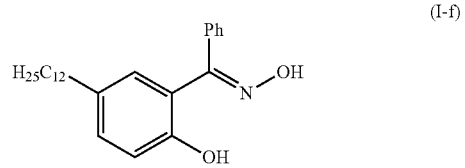

(I-f)

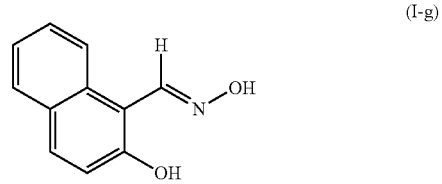

(I-g)

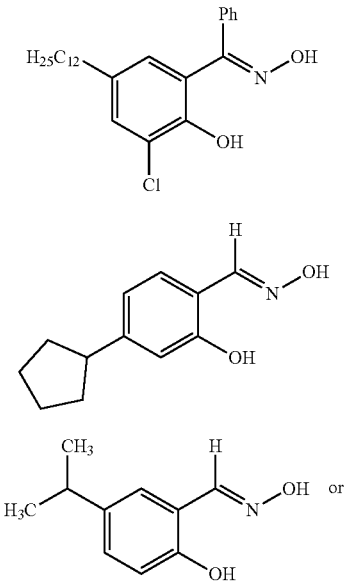 (I-h)
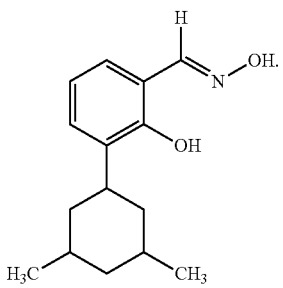 (I-k)
38. The method of claim 16, wherein the composition has a pH of at least about 12.
39. The method of claim 16, wherein the composition has a pH of at most about 16.
40. The composition of claim 1, wherein the composition has a pH of at most about 16.
* * * * *

UNITED STATES PATENT AND TRADEMARK OFFICE
CERTIFICATE OF CORRECTION

PATENT NO. : 10,696,932 B2
APPLICATION NO. : 15/745203
DATED : June 30, 2020
INVENTOR(S) : Raj Sakamuri et al.

Page 1 of 1

It is certified that error appears in the above-identified patent and that said Letters Patent is hereby corrected as shown below:

In the Claims

Column 19
Line 17 (Approx.), in Claim 3, delete "N-ethyl ethanolamine," and insert -- N-ethylethanolamine, --
Line 34 (Approx.), in Claim 6, delete "tetrametyl" and insert -- tetramethyl --

Column 23
Line 21, in Claim 27, delete "N-methyl di ethanol amine, N-ethyl ethanol amine," and insert
-- N-methyldiethanolamine, N-ethylethanolamine, --
Line 38, in Claim 30, delete "tetrametyl" and insert -- tetramethyl --
Line 54, in Claim 36, delete "composition" and insert -- method --

Signed and Sealed this
Eighteenth Day of August, 2020

Andrei Iancu
*Director of the United States Patent and Trademark Office*